(12) United States Patent
Chen (10) Patent No.: US 8,179,112 B2
(45) Date of Patent: May 15, 2012

(54) DIRECT CURRENT GENERATOR AND THE PULSE GENERATOR THEREOF

(75) Inventor: Chi-Jen Chen, Taoyuan County (TW)

(73) Assignee: Qisda Corporation, Taoyuan County (TW)

( * ) Notice: Subject to any disclaimer, the term of this patent is extended or adjusted under 35 U.S.C. 154(b) by 389 days.

(21) Appl. No.: 12/504,667

(22) Filed: Jul. 17, 2009

(65) Prior Publication Data
US 2010/0014328 A1     Jan. 21, 2010

(30) Foreign Application Priority Data
Jul. 18, 2008   (TW) .............................. 97127430 A (51) Int. Cl.
*G05F 1/40*     (2006.01)
(52) U.S. Cl. ...................................... 323/283; 323/268
(58) Field of Classification Search .................. 323/222, 323/224, 282–288, 263, 276; 363/16–19, 363/37, 39, 41, 57, 65
See application file for complete search history.

(56) References Cited

U.S. PATENT DOCUMENTS

| | | | | |
|---|---|---|---|---|
| 4,536,700 A * | 8/1985 | Bello et al. | ..................... | 323/285 |
| 5,648,918 A * | 7/1997 | Hubbard | ....................... | 702/107 |
| 5,747,976 A * | 5/1998 | Wong et al. | .................... | 323/282 |
| 5,770,940 A * | 6/1998 | Goder | ............................ | 323/282 |
| 5,949,665 A * | 9/1999 | Seong | ............................. | 363/41 |
| 6,198,264 B1* | 3/2001 | Nagaya et al. | ................ | 323/284 |
| 7,330,019 B1* | 2/2008 | Bennett | ........................ | 323/282 |
| 8,058,859 B2* | 11/2011 | Xu | ................................. | 323/284 |

* cited by examiner

*Primary Examiner* — Rajnikant Patel (57) ABSTRACT

The present invention provides a direct current generator and a pulse generator thereof. The pulse generator includes a comparator to replace a central processing unit and a logic integrated circuit to save the costs and space required by the electronic components. The pulse generator generates pulses to control the activation of the direct current generator and then to control the output current of the direct current generator. The direct current generator generates current having pulses based on pulses signals from the pulse generator to drive a load.

20 Claims, 6 Drawing Sheets

DIRECT CURRENT GENERATOR AND THE PULSE GENERATOR THEREOF

BACKGROUND OF THE INVENTION

1. Field of the Invention

The present invention relates to a direct current generator and a pulse generator thereof and specifically to a direct current generator used in a light source system and a pulse generator thereof.

2. Description of the Prior Art

Currently, technologies used to generate pulse current include the switched mode power supply. The device used to generate pulse current includes electronic components such as central processing units and logic integrated circuits. However, the cost of the above-mentioned electronic components is relatively high and thus may easily increases the production cost of the product. Furthermore, the electronic components generally occupy a certain space in switched mode power supply. The above-mentioned reasons may directly increase the price and the volume of the products and thus reduces the competitiveness of the products.

SUMMARY OF THE INVENTION

It is an object of the present invention to provide a direct current generator and a pulse generator thereof, wherein the direct current generator includes a comparator and analog circuits to replace central processing unit and the logic integrated circuit to save costs and space of electronic components.

The pulse generator of the present invention generates a plurality of pulse signals for switching the driving switch in the direct current generator and for controlling the output power of the direct current generator. The pulse generator includes a control circuit, a comparator, and a pulse output unit. The control circuit is used to output a switching signal to the comparator based on a control signal from a signal processing unit. The control signal includes a high level and a low level. The control circuit also includes a first reference voltage source for outputting a first reference signal to be processed by the comparator.

The direct current generator includes a direct current voltage source, a driving circuit, and a pulse generator. The driving circuit of the direct current generator receives a plurality of pulse signals, wherein the switch of the driving circuit is turned on or off according to the pulse signals. The direct current generator further includes an initiator for providing an initial voltage of high level to initiate and drive a load.

DETAILED DESCRIPTION OF THE PREFERRED EMBODIMENT

The present invention provides a direct current generator and a pulse generator thereof to generate a direct current having pulses. In one embodiment of the present invention, the direct current is used to drive lamps in an image system to emit light, wherein the above-mentioned image system includes consumer products such as projectors and flat display devices, but is not limited thereto. In the embodiments disclosed below, the direct current generator and the pulse generator are used to drive lamps, but are not limited thereto and can be used to drive other devices requiring direct current.

Figure 1:
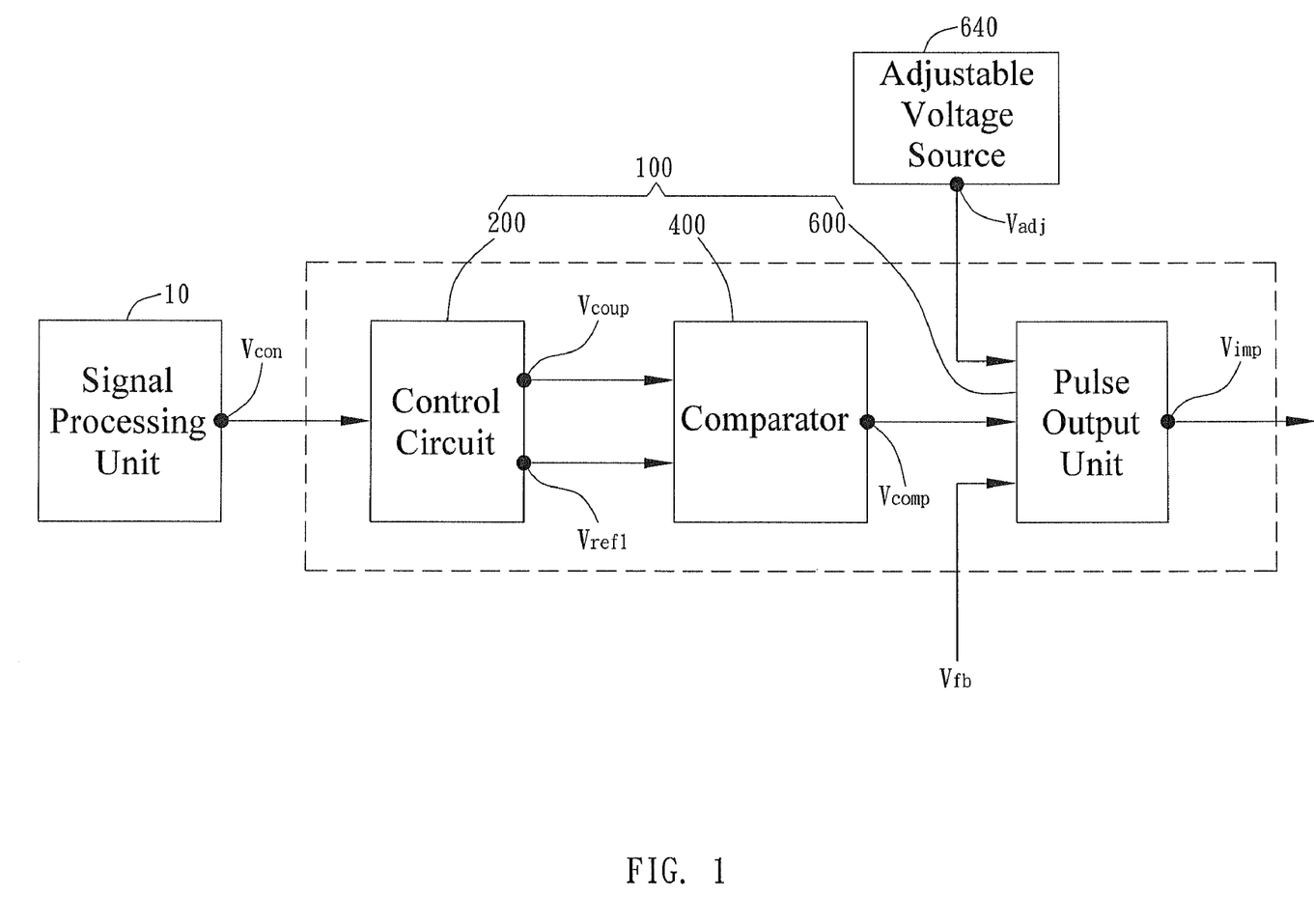
FIG. 1 is a block diagram illustrating the pulse generator of the present invention.

The pulse generator of the present invention preferably generates a plurality of pulse signals for activating the switch in a switched-mode power supply. In other words, the pulse generator controls the output power of the direct current generator by turning the switch on or off. FIG. 1 is a block diagram of the pulse generator of the present invention. As FIG. 1 shows, the pulse generator 100 includes a control circuit 200, a comparator 400, and a pulse output unit 600. The control circuit 200 is coupled with a signal processing unit 10 and outputs a switching signal $V_{coup}$ based on a control signal $V_{con}$ from the signal processing unit 10. The signal processing unit 10 includes a processor of personal computers or a microprocessor, but is not limited thereto. The signal processing unit 10 includes other signal processors for outputting the control signal $V_{con}$ based on required luminance or other output requirements. The control signal $V_{con}$ is a digital signal including a high level voltage and a low level voltage. The control circuit 200 includes a first reference voltage source for outputting a first reference signal $V_{ref1}$ to be processed by the comparator 400. As FIG. 1 shows, the comparator 400 compares the amplitude of the switching signal $V_{coup}$ and that of the first reference signal $V_{ref1}$ and outputs a comparison signal $V_{comp}$ at its first output terminal. The amplitude of the comparison signal $V_{comp}$ alternates between high level and low level. Furthermore, the comparator 400 is coupled to the pulse output unit 600 and outputs the comparison signal $V_{comp}$ to the pulse output unit 600.

As shown in FIG. 1, the pulse signal $V_{imp}$ from the pulse output unit 600 is configured to control a driving switch of a direct current generator. The pulse output unit 600 is configured to receive the comparison signal $V_{comp}$ as well as a feedback signal $V_{fb}$, and an adjustable voltage $V_{adj}$ from an adjustable power source, wherein the feedback signal $V_{fb}$ is directly proportional to the output voltage of the direct current generator (not illustrated). The pulse output unit 600 outputs a plurality of pulse signals based on the comparison signal $V_{comp}$, the feedback signal $V_{fb}$, and the adjustable voltage $V_{adj}$. In the present embodiment, the pulse signals $V_{imp}$ have a substantially same amplitude while the width of the pulse signal $V_{imp}$ is directly proportional to the sum of the comparison signal $V_{comp}$ and the adjustable voltage $V_{adj}$.

Figure 2:
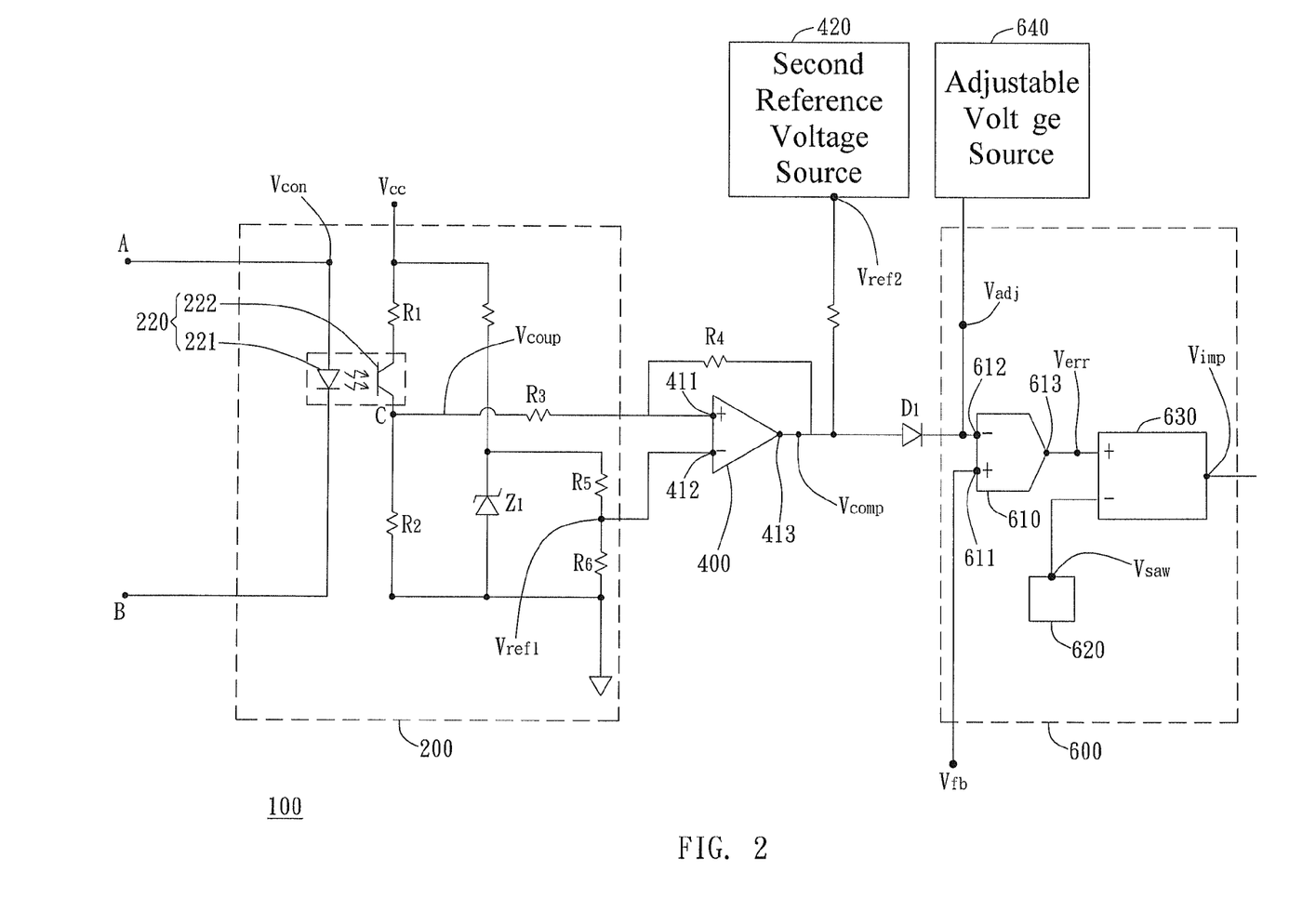
FIG. 2 is a circuit diagram of the pulse generator of the present invention.

FIG. 2 is a circuit diagram of the pulse generator of the present invention. In the embodiment illustrated in FIG. 2, point A and point B are coupled to the signal processing unit 10 (not illustrated) to receive the control signal $V_{con}$. The control signal $V_{con}$ is a digital signal and includes high level and low level. In the present embodiment, the switching signal $V_{coup}$ and the control signal $V_{con}$ have a same waveform and thus the switching signal $V_{coup}$ also alternates between high level and low level.

In the embodiment illustrated in FIG. 2, the control circuit 200 includes an optical coupler 220, a first resistor R1, and a second resistor R2 for outputting the switching signal $V_{coup}$ based on the control signal $V_{con}$ from the signal processing unit 10. The switching signal $V_{coup}$ is then processed by the comparator 400. The optical coupler 220 turns on or off based on the control signal $V_{con}$. The optical coupler 220 includes a light emitting diode 221 and an optical transistor 222. In the present embodiment, anode and cathode of the light emitting diode 221 are respectively coupled with point A and point B. Furthermore, point A and point B are coupled with the signal processing unit 10 to receive the control signal $V_{con}$. In different embodiments, point A can be coupled with a constant voltage source (such as 2.5V) while point B can be coupled with the signal processing unit 10 to receive the control signal $V_{con}$. The control signal $V_{con}$ can alternate between high level (such as 5V) and low level (such as 0V) in order to control the flow of the current between point A and point B. The light emitting diode 221 selectively emits light to the optical transistor 222 according to the voltage difference and the direction of current flow between point A and point B. The optical transistor 222 conducts when receiving light from the light emitting diode 221 and stops conducting when the light emitting diode 221 stops emitting light. In different embodiments, other suitable electronic switches can be used to replace the photoelectric switch 220.

As FIG. 2 shows, when the optical transistor 222 conducts, the first resistor R1 and the second resistor R2 form a voltage divider which outputs the switching signal $V_{coup}$. The switching signal $V_{coup}$ and the control signal $V_{con}$ have substantially the same waveform but may have different amplitudes. The Zener diode Z1 is configured to limit the voltage at point C to 5V. In this way, the switching signal $V_{coup}$ alternates between 5V and 0V. On the other hand, the control circuit 200 includes a first reference voltage source 230 [not shown in FIG. 2.] for outputting the first reference signal $V_{ref1}$ to the second input terminal 412 of the comparator 400. The first reference voltage source 230 includes a fifth resistor R5 and a sixth resistor R6 and the two resistors form another voltage divider. The voltage divider then processes the voltage across the zener diode Z1 and outputs the first reference signal $V_{ref1}$. The resistance of the fifth resistor R5 and that of the sixth resistor R6 are preferably the same, but are not limited thereto.

As FIG. 2 shows, the comparator 400 is used to compare the amplitude of the switching signal $V_{coup}$ with that of the first reference signal $V_{ref1}$. In the present embodiment, when the amplitude of the switching signal $V_{coup}$ is greater than that of the first reference signal $V_{ref1}$, the first output terminal 413 of the comparator 400 will output a corresponding comparison signal $V_{comp}$. Furthermore, the comparator 400 preferably has a structure of Schmitt Trigger, but is not limited thereto. In the present embodiment, the first input terminal 411 is a non-inverting input while the second input terminal 412 is an inverting input. Thus the comparator 400 of the present embodiment will output a high level signal when the amplitude of the switching signal $V_{coup}$ is greater than that of the first reference signal $V_{ref1}$. However, in different embodiments, the comparator 400 can include other electronic components used to compare amplitudes of two signals (such as a differential amplifier). In different embodiment, a second reference voltage source 420 is coupled with the first output terminal 413 to control the amplitude of the outputted comparison signal $V_{comp}$. Thus the second reference voltage source 420 can be used to limit the comparison signal $V_{comp}$ to other voltage levels such as 5V or 12V. The direct current generator of the present invention outputs an output current whose amplitude depends on the amount of load to be driven. Thus in different embodiments, the second reference voltage source 420 can increase or decrease its output in accordance with the output current. The pulse generator of the present invention can also include a sensing resistor (not illustrated) coupled with the load (not illustrated) for sensing the output current and then outputting a sensing voltage corresponding to the output current. The first diode D1 limits the direction of current flow between the first output terminal and the pulse output unit 600.

In the embodiment illustrated in FIG. 2, the pulse output unit 600 further includes an error detector 610 for measuring a difference between two voltages to output an error signal $V_{err}$ equal to or proportional to the voltage difference. The difference between the error detector 610 and the comparator 400 is that the output of the comparator 400, i.e. comparison signal $V_{comp}$ can only be a high level voltage or a low level voltage while the output of the error detector 610 is the voltage difference among received signals, i.e. the error signal $V_{err}$. Thus the output of the error detector 610 is not limited to only two different voltages. The error detector 610 has a third input terminal 611, a fourth input terminal 612, and a second output terminal 613. The third input terminal 611 corresponds to the non-inverting input terminal of the error detector 610 while the fourth input terminal 612 corresponds to the inverting input terminal of the error detector 610.

The third input terminal 611 illustrated in FIG. 2 also receives the feedback signal $V_{fb}$, wherein the feedback signal $V_{fb}$ is obtained by processing an output voltage of a driving circuit (not illustrated) using voltage divider. The fourth input terminal 612 is coupled with the first output terminal 413 of the comparator 400 to receive the comparison signal $V_{comp}$. The error detector 610 outputs the error signal $V_{err}$ based on the amplitude of the feedback signal $V_{fb}$ and that of the comparison signal $V_{comp}$, for a pulse width modulator 630 to process. Furthermore, the fourth input terminal 612 can be coupled with the adjustable voltage source 640 to receive the adjustable voltage $V_{adj}$. The adjustable voltage $V_{adj}$ is preferably a constant voltage which fixes the voltage input to the pulse width modulator 630. In this way, the pulse width modulator 630 will output pulse signals $V_{imp}$ of the same width. The output voltage of the adjustable voltage source 640 can be selectively adjusted. As FIG. 2 shows, the voltage inputted into the fourth input terminal 612 is a sum of the adjustable voltage $V_{adj}$ and the comparison signal $V_{comp}$, but is not limited thereto.

As FIG. 2 shows, an oscillator 620 of the pulse output unit 620 is used to output a sawtooth signal $V_{saw}$, but is not limited thereto. The oscillator 620 can output a triangle wave to be processed by the pulse width modulator 630. Furthermore, the pulse width modulator 630 compares the amplitude of the error signal $V_{err}$ and that of the sawtooth signal $V_{saw}$ and then outputs a plurality of pulse signals $V_{imp}$. The pulse signals $V_{imp}$ have substantially equal amplitude but may have different width. The pulse signals have a high level voltage or a low level voltage and can alternate between the two levels of voltage.

Figure 3A:
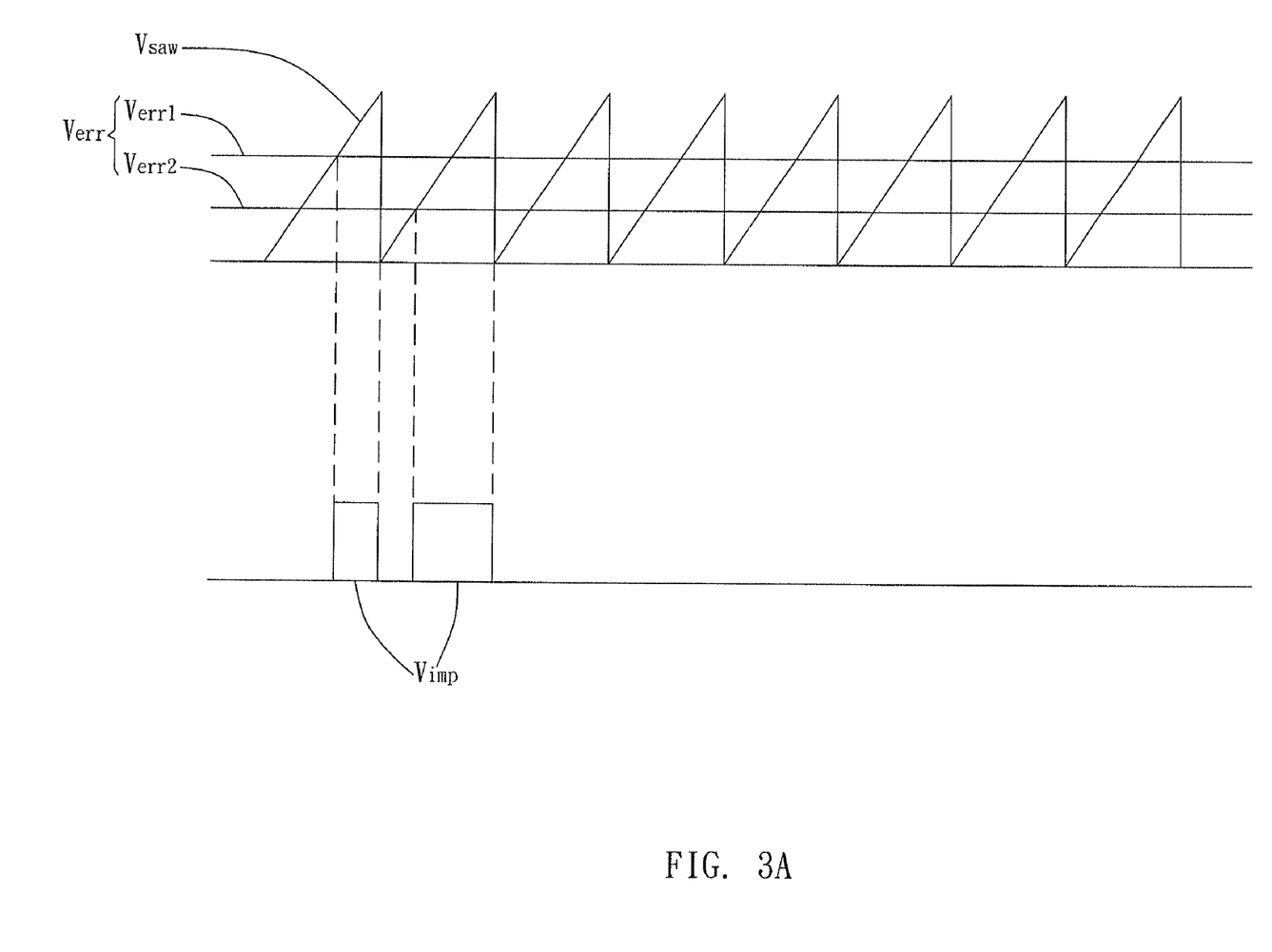
FIG. 3A is a waveform diagram of error signal, sawtooth signal from the oscillator, and pulse signal.

FIG. 3A is a waveform diagram of the error signal, the sawtooth signal from the oscillator, and the pulse signal. In the embodiment illustrated in FIG. 3A, the width of the pulse signal $V_{imp}$ is directly proportional to the time during which the amplitude of the sawtooth signal $V_{saw}$ is greater than that of the error signal $V_{err}$. In other words, the pulse signal $V_{imp}$ of the present embodiment will be at high level when the amplitude of the sawtooth signal $V_{saw}$ is greater than that of the error signal $V_{err}$. The pulse signal $V_{imp}$ will be at low level when the amplitude of the sawtooth signal $V_{saw}$ is smaller than that of the error signal $V_{err}$. However, alternatively, the pulse signal $V_{imp}$ can be at low level when the amplitude of the sawtooth signal $V_{saw}$ is greater than that of the error signal $V_{err}$, and the pulse signal $V_{imp}$ can be at high level when the amplitude of the saw tooth signal $V_{saw}$ is smaller than that of the error signal $V_{err}$.

Figure 3B:
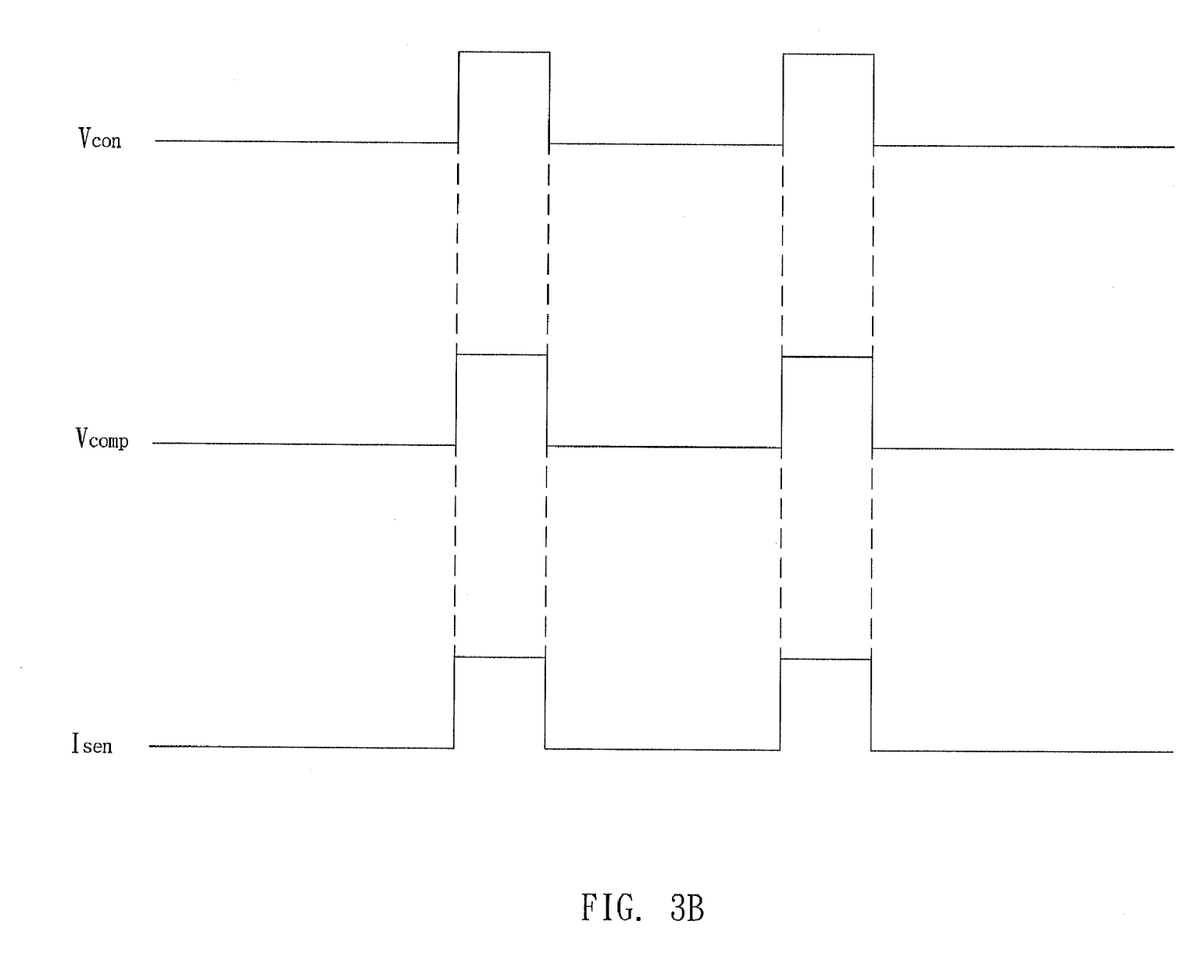
FIG. 3B is a waveform diagram of control signal, comparison signal, and output current.

Please refer to both FIG. 3A and FIG. 3B, the control signal $V_{con}$ and the comparison signal $V_{comp}$ change at substantially the same time. In other words, the control signal $V_{con}$ can alternate between different levels to control the output of the comparator 400 which in turn control the width of the pulse signal $V_{imp}$ from the pulse output unit 600. In the embodiment illustrated in FIG. 3A, the error signal $V_{err}$ has two different levels. The error signal $V_{err1}$ with higher amplitude corresponds to the comparison signal $V_{comp}$ of lower level while the error signal $V_{err2}$ corresponds to the comparison signal $V_{comp}$ of higher level, but is not limited thereto. The relationship between signals mentioned above can be changed by modifying connections within the circuit of the pulse output unit 600.

Please refer to FIG. 2, FIG. 3A, and FIG. 3B, wherein FIG. 3B is a waveform diagram of the control signal $V_{con}$, the comparison signal $V_{comp}$, and the output current $I_{sen}$. In the present embodiment, signals outputted into the fourth input terminal 612 includes the comparison signal $V_{comp}$ and the adjustable voltage $V_{adj}$. Thus the error signal $V_{err}$ outputted by the error detector 610 can be represented by the following equation:

$$V_{err} = V_{fb} - (V_{adj} + V_{comp}) \qquad (1)$$

It can be seen from Equation (1) that the error signal $V_{err}$ is inversely proportional to the comparison signal $V_{comp}$. In the present embodiment, the feedback signal $V_{fb}$ and the adjustable voltage $V_{adj}$ are substantially constant. When the comparison signal $V_{comp}$ and the control signal $V_{con}$ is at a low level, the corresponding error signal $V_{err1}$ will produce pulse signals $V_{imp}$ of equal width. When the comparison signal $V_{comp}$ and the control signal $V_{con}$ are both at high level, the voltage of the corresponding error signal $V_{err2}$ will be lower than that of the error signal $V_{err1}$. Consequently, the error signal $V_{err2}$ with lower voltage will produce pulse signals $V_{imp}$ with higher width, which in turn allows the direct current generator to produce output current $I_{sen}$ having pulses.

Figure 4:
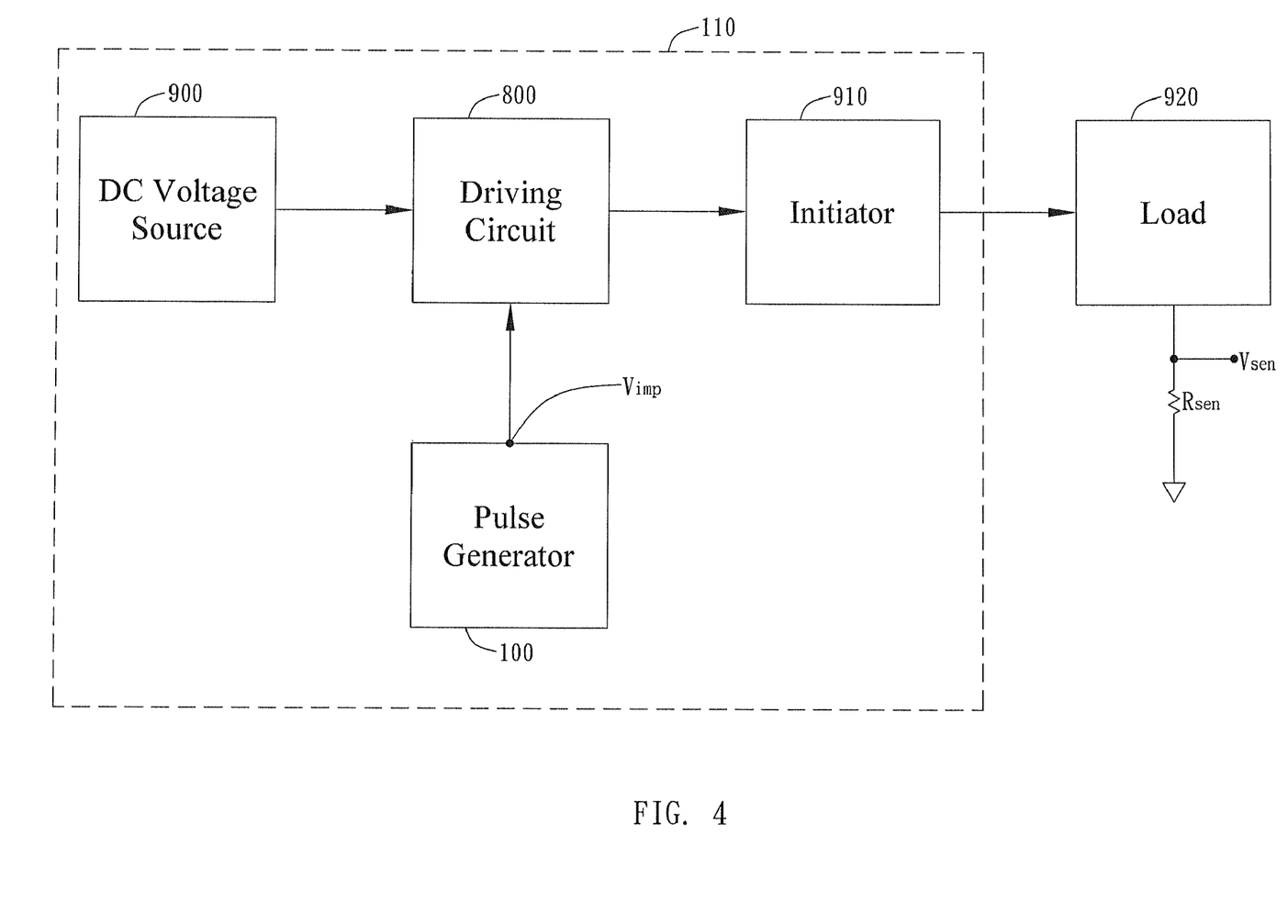
FIG. 4 is a block diagram of the direct current generator of the present invention.

FIG. 4 is a block diagram of the direct current generator 110 of the present invention, wherein the direct current generator 110 preferably includes a switched mode power supply. The function of the direct current generator 110 is to transform a direct current (DC) voltage into another DC voltage of different amplitude. As FIG. 4 shows, the direct current generator 110 includes a pulse generator 100, a driving circuit 800, a DC voltage source 900, and an initiator 910. The DC voltage source 900 of the present invention provides DC voltages to the driving circuit 800. The DC voltage source 900 of the present embodiment includes a rectifier for transforming an alternating current (AC) voltage into a DC voltage. The DC voltage source 900 also includes a power factor correction circuit for improving the power factor, but is not limited thereto. The DC voltage source 900 can also include other suitable elements for outputting DC voltages. The driving circuit 800 is coupled to the DC voltage source 900 to receive DC voltages. Furthermore, the driving circuit 800 is coupled to the pulse generator 100 to receive a plurality of pulse signals $V_{imp}$. The direct current generator 110 drives a load 920 by transmitting a current having pulses to the load 920 based on the pulse signal from the pulse generator 100. The initiator 910 is coupled to the driving circuit 800 to receive an output voltage and then provides an initial voltage to the load 920. In the present embodiment, the initial voltage is a pulse with high amplitude (substantially 600 volts to 5000 volts). The function of the initial voltage is to initiate the load 920 to be driven by the output voltages from the driving circuit 800 and to provide power to the load 920. That is, the initiator 940 serves to initiate the load 920 and the supply power. In the present embodiment, the load 920 is a high-intensity discharge lamp, but is not limited thereto. The load 920 can includes other devices driven by the DC power source.

Furthermore, the direct current generator 110 further includes a sensing resistor $R_{sen}$ connected in series with the load 920, wherein the output current flowing through the load 920 produces a sensing voltage $V_{sen}$ across the sensing resistor $R_{sen}$. The sensing voltage $V_{sen}$ is used to measure the amplitude of the output current flowing through the load 920 and the measurement is used as a reference for the output of the second reference voltage source in the pulse generator 100.

Figure 5:
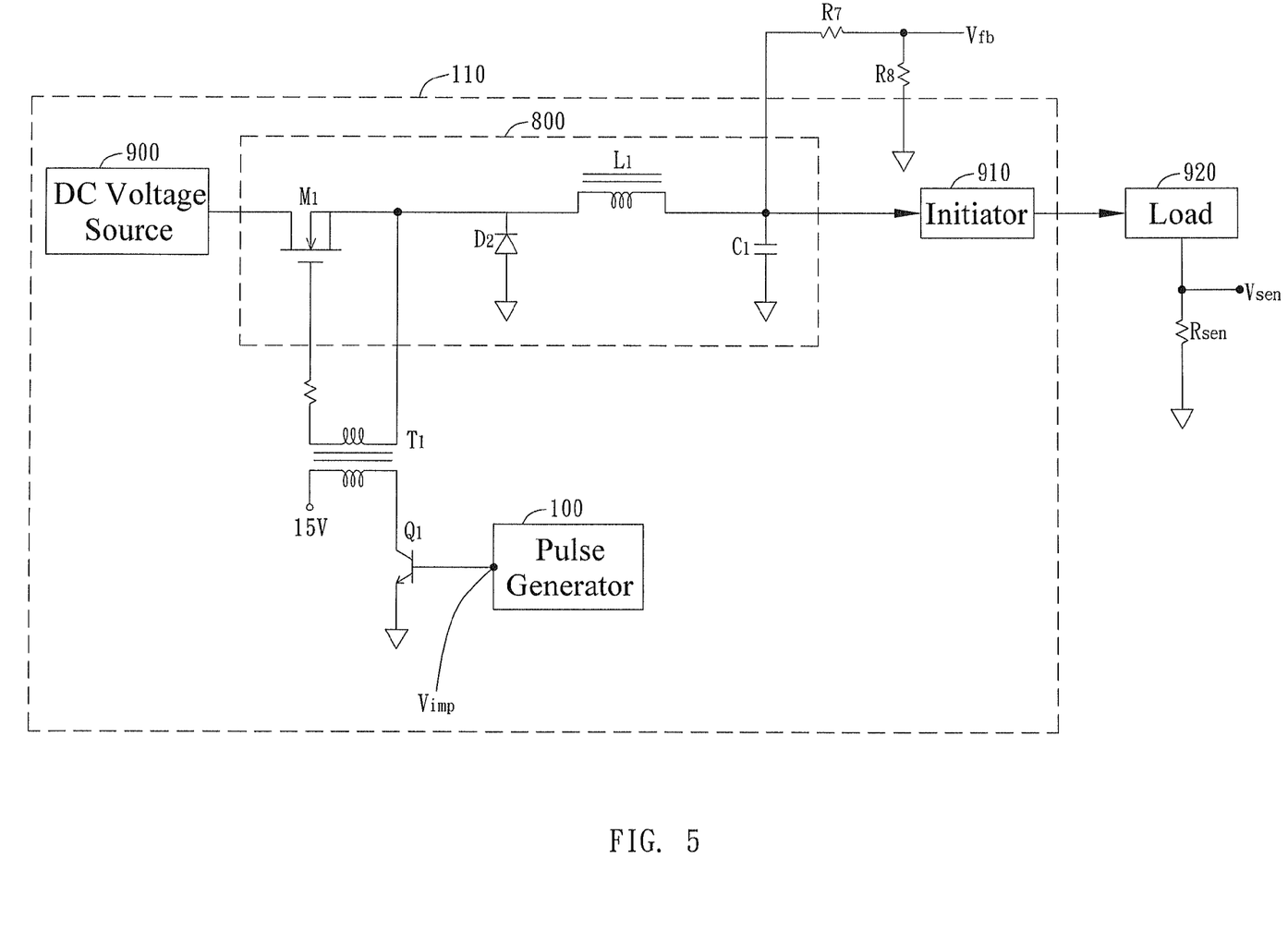
FIG. 5 is a circuit diagram of the direct current generator of the present invention.

FIG. 5 is a circuit diagram of the direct current generator of the present invention. In the present embodiment, the driving circuit 800 includes a buck converter and is used to transform a higher voltage from the DC voltage source 900 into a lower voltage for the initiator 910 to provide the load 920 with appropriate voltage. The pulse signal $V_{imp}$ is used to activate the bipolar transistor Q1 and allow the current to flow through the bipolar transistor Q1. Furthermore, the output voltage from the driving circuit 800 will be transformed by the voltage divider formed by the resistors R7 and R8 into a feedback signal $V_{fb}$ of smaller voltage. The feedback signal $V_{fb}$ is then processed by the error detector 610 of the pulse output unit 600. The initiator 910 and its function have been explained above and thus will not be elaborated again.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A pulse generator for driving a direct current generator, the direct current generator generating a feedback signal, the pulse generator being coupled with a signal processing unit, and the signal processing unit generating a control signal, the pulse generator comprising:
   a control circuit comprising a first reference voltage source, wherein the first reference voltage source generates a first reference signal, the control circuit outputs a switching signal based on the control signal of the signal processing unit;
   a comparator comprising a first input terminal, a second input terminal, and an output terminal, wherein the first input terminal is coupled with the control circuit, the second input terminal is coupled with the first reference voltage source to receive the first reference signal, the output terminal outputs a comparison signal based on the switching signal and the first reference signal; and
   a pulse output unit coupled with the comparator to receive the comparison signal, wherein the pulse output unit outputs a pulse signal based on the comparison signal and the feedback signal.

2. The pulse generator of claim 1, wherein the first reference signal is a constant voltage.

3. The pulse generator of claim 1, wherein an amplitude of the comparison signal is directly proportional to a width of the pulse signal.

4. The pulse generator of claim 1, wherein the pulse output unit comprises an error detector, the error detector comprises:
   a third input terminal for receiving the feedback signal;
   a fourth input terminal coupled with the output terminal of the comparator to receive the comparison signal; and
   a second output terminal for generating an error signal based on a voltage difference between the third input terminal and the fourth input terminal,
   wherein the pulse output unit adjusts a width of the pulse signal based on an amplitude of the error signal.

5. The pulse generator of claim 4, further comprising an adjustable power source coupled with the fourth input terminal, wherein the adjustable power source can selectively output an adjustable voltage to the fourth input terminal, wherein a voltage at the fourth input terminal is a sum of the comparison signal and the adjustable voltage.

6. The pulse generator of claim 1, further comprising a second reference voltage source coupled with the output terminal of the comparator, wherein an amplitude of the comparison signal is determined by a voltage at the second reference voltage source.

7. The pulse generator of claim 6, further comprising a sensing resistor for sensing an output current from the direct current generator to generate a sensing voltage, wherein the second reference voltage source controls the amplitude of the comparison signal based on the sensing voltage.

8. The pulse generator of claim 1, wherein the control circuit further comprising a switch, the switch turns on or off according to the control signal to generate the switching signal, the first input terminal is coupled with the control circuit to receive the switching signal, the comparator outputs the comparison signal when a voltage of the switching signal is greater than a voltage of the first reference signal.

9. The pulse generator of claim 1, wherein the first reference voltage source comprising:
a voltage divider comprising a first resistor and a second resistor, wherein the first resistor and the second resistor are connected in series; and
a zener diode connected in parallel with the voltage divider, wherein the first reference signal is a voltage at a connection point of the first resistor and the second resistor.

10. A direct current generator, comprising:
a driving circuit comprising a driving switch for driving a load and generating a feedback signal;
a pulse generator coupled with a signal processing unit, wherein the signal processing unit generates a control signal, the pulse generator comprises:
  a control circuit comprising a first reference voltage source, wherein the first reference voltage source generates a first reference signal, the control circuit outputs a switching signal based on the control signal of the signal processing unit;
  a comparator comprising a first input terminal, a second input terminal, and an output terminal, wherein the first input terminal is coupled with the control circuit, the second input terminal is coupled with the first reference voltage source to receive the first reference signal, the output terminal outputs a comparison signal based on the switching signal and the first reference signal; and
  a pulse output unit coupled with the comparator to receive the comparison signal, wherein the pulse output unit outputs a pulse signal based on the comparison signal and the feedback signal,
wherein the driving circuit outputs a current having a pulse to the load based on the pulse signal generated from the pulse generator.

11. The direct current generator of claim 10, wherein the load is a lamp and the feedback signal is a driving voltage of the lamp.

12. The direct current generator of claim 10, further comprising an initiator, wherein one end of the initiator is electrically connected to the driving circuit while the other end of the initiator is electrically connected to the load, the initiator outputs an initial voltage to initiate the load.

13. The direct current generator of claim 10, wherein the first reference signal is a constant voltage.

14. The direct current generator of claim 10, wherein the comparator is a differential amplifier.

15. The direct current generator of claim 10, wherein an amplitude of the comparison signal is directly proportional to a width of the pulse signal.

16. The direct current generator of claim 10, wherein the pulse output unit comprises an error detector, the error detector comprises:
a third input terminal for receiving the feedback signal;
a fourth input terminal coupled with the output terminal of the comparator to receive the comparison signal; and
a second output terminal for generating an error signal based on a voltage difference between the third input terminal and the fourth input terminal,
wherein the pulse output unit adjusts a width of the pulse signal based on an amplitude of the error signal.

17. The direct current generator of claim 16, further comprising an adjustable power source coupled with the fourth input terminal, wherein the adjustable power source selectively output an adjustable voltage to the third input terminal, wherein a voltage at the fourth input terminal is a sum of the comparison signal and the adjustable voltage.

18. The direct current generator of claim 10, further comprising a second reference voltage source coupled with the output terminal of the comparator, wherein an amplitude of the comparison signal is determined by a voltage at the second reference voltage source.

19. The direct current generator of claim 10, further comprising a sensing resistor for sensing an output current from the direct current generator to generate a sensing voltage, the second reference voltage source controls the amplitude of the comparison signal based on the sensing voltage.

20. The direct current generator of claim 10, wherein the control circuit further comprises a switch, the switch turns on or off according to the control signal to generate the switching signal, the first input terminal is coupled with the control circuit to receive the switching signal, the comparator outputs the comparison signal when a voltage of the switching signal is greater than a voltage of the first reference signal.

* * * * *